United States Patent [19]

Parks et al.

[11] Patent Number: 4,933,296
[45] Date of Patent: Jun. 12, 1990

[54] N+ AMORPHOUS SILICON THIN FILM TRANSISTORS FOR MATRIX ADDRESSED LIQUID CRYSTAL DISPLAYS

[75] Inventors: Harold G. Parks; William W. Piper, both of Scotia; George E. Possin; Donald E. Castleberry, both of Schenectady, all of N.Y.

[73] Assignee: General Electric Company, Schenectady, N.Y.

[21] Appl. No.: 761,938

[22] Filed: Aug. 2, 1985

[51] Int. Cl.$^5$ ............................................. H01L 29/78
[52] U.S. Cl. ...................................... 437/40; 437/43; 437/50; 437/181; 437/187; 437/192; 357/23.7
[58] Field of Search ............. 148/DIG. 20, DIG. 147, 148/DIG. 53; 357/23.7, 71; 156/643, 664; 204/192 C; 437/40, 43, 192, 50, 181, 187

[56] References Cited

U.S. PATENT DOCUMENTS

| 3,806,365 | 4/1974 | Jacob | 204/164 |
|---|---|---|---|
| 3,967,981 | 7/1976 | Yamazaki | 29/571 |
| 4,149,307 | 4/1979 | Henderson | 29/571 |
| 4,365,274 | 12/1982 | Takenouchi et al. | 29/572 |
| 4,558,340 | 12/1985 | Schachter et al. | 357/23.7 |

OTHER PUBLICATIONS

Murarka, "Refractory Silicides for Integrated Circuits", *J. Vac. Sci. Technol.*, 17(4), Jul./Aug. 1980.
Rand, "Plasma-Promoted Deposition of Thin Inorganic Films", *J. Vac. Sci. Technol.*, Mar./Apr. 1979.
Bare, "Etching Patterns in Amorphous Silicon", *J. Vac. Sci. Technol.*, A4(2), Mar./Apr. 1986.
Ghandi, *VLST Fabrication Principles, Silicon and Gallium Arsenide*, John Wiley and Sons, New York, 1983, pp. 437-439, 504-510 and 524-525.
Colclaser, *Microelectronics: Processing and Device Design*, John Wiley and Sons, New York, 1980, pp. 110 and 111.
"Silicon TFTs for Flat Panel Displays", by F. Morin and M. LeContellec, Hewlett Packard Journal (date unknown).
"Amorphous-Silicon Thin-Film Metal-Oxide-Semiconductor Transistors", by Hiroshi Hayama and Masakiyo Matsumura, *Applied Physics Letters*, vol. 36, No. 9 (May 1980).
"Amorphous Silicon-Silicon Nitride Thin-Film Transistors", by M. J. Powel et al., *Applied Physics Letters*, vol. 38, No. 10 (May 1981).
"Application of Amorphous Silicon Field Effect Transistors in Addressable Liquid Crystal Display Panels", by A. J. Snell et al., *Applied Physics*, vol. 24, pp. 357-362 (1981).
"A TFT-Addressed Liquid Crystal Color Display", by M. Sugata et al. (Oct. 1983), Proceedings of the Third International Display Research Conference, Paper No. 53.
"Amorphous-Silicon TFT Array for LCD Addressing", by M. V. C. Stroomer, Electronic Letters, vol. 18, No. 20 (1982).
"High Resolution Transparent-Type a-Si TFT LDCs", by K. Suzuki et al., *SID Digest* (1983).
"Promise and Challenge of Thin-Film Silicon Approaches to Active Matrices", by A. I. Lakatos, 1982 International Display Research Conference, IEEE, pp. 146-151.
"Application of Amorphous Silicon Field Effect Transistors in Integrated Circuits", by A. J. Snell et al., *Applied Physics*, vol. A26, pp. 83-86.

*Primary Examiner*—Olik Chaudhuri
*Attorney, Agent, or Firm*—Marvin Snyder; James C. Davis, Jr.

[57] ABSTRACT

A thin film FET switching element, particularly useful in liquid crystal displays (LCDs) employs particular materials and is fabricated via a particular process to ensure chemical compatibility and the formation of good electrical contact to an amorphous silicon layer while also producing FETs with desirable electrical properties for LCDs. These materials include the use of titanium as a gate electrode material and the use of N+ amorphous silicon as a material to enhance electrical contact between molybdenum source and drain pads and an underlying layer of amorphous silicon. The process of the present invention provides enhanced fabrication yield and device performance.

15 Claims, 6 Drawing Sheets

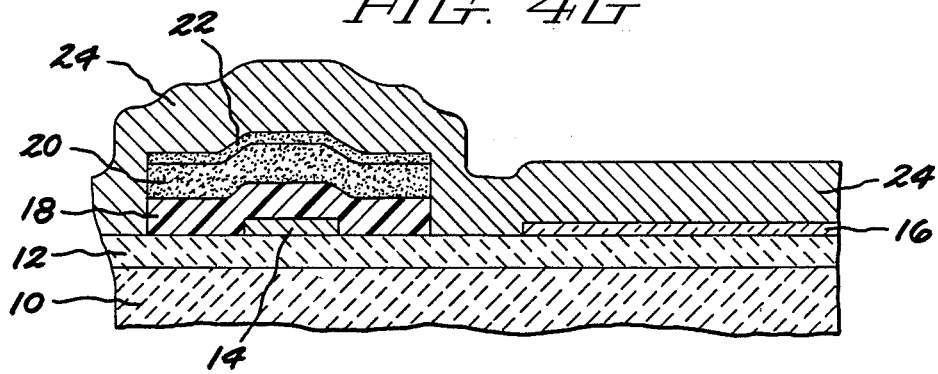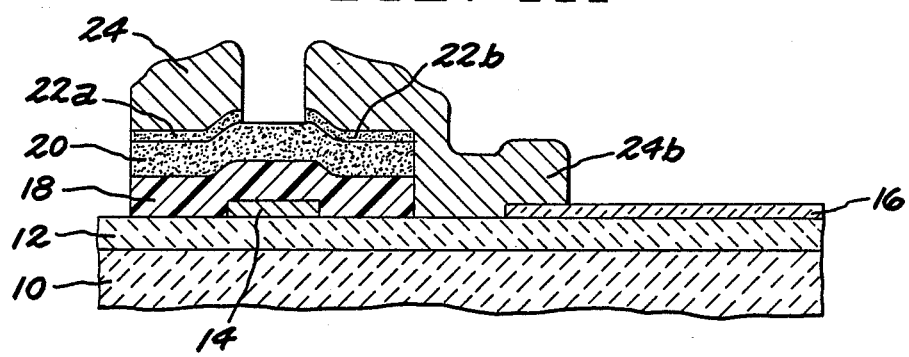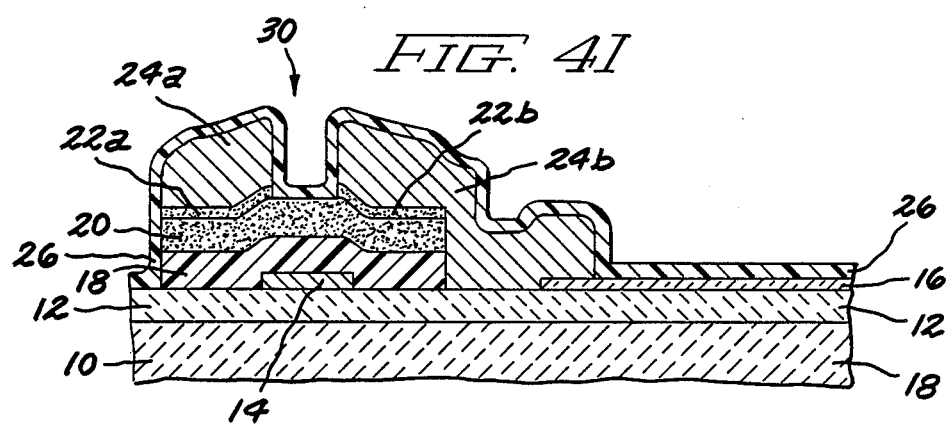

N+ AMORPHOUS SILICON THIN FILM TRANSISTORS FOR MATRIX ADDRESSED LIQUID CRYSTAL DISPLAYS

BACKGROUND OF THE INVENTION

The present invention is generally directed to a process for the fabrication of thin film field effect transistors employed in matrix addressed liquid crystal displays. More particularly, the present invention is directed to the utilization of specific materials in the field effect transistor (FET) fabrication process and structure. Even more particularly, the present invention is directed to the solution of material process compatibility problems and to the problem of pixel element discharge during off cycles.

A liquid crystal display device typically comprises a pair of flat panels sealed at their outer edges and containing a quantity of liquid crystal material. These liquid crystal materials typically fall into two categories: dichroic dyes and a guest/host system or twisted nematic materials. The flat panels generally possess transparent electrode material disposed on their inner surfaces in predetermined patterns. One panel is often covered completely by a single transparent "ground plane" electrode. The opposite panel is configured with an array of transparent electrodes, referred to herein as "pixel" (picture element) electrodes. Thus, a typical cell in a liquid crystal display includes liquid crystal material disposed between a pixel electrode and a ground electrode forming, in effect, a capacitor like structure disposed between transparent front and back panels. In general, however, transparency is required for only one of the two panels and the electrodes disposed thereon.

In operation, the orientation of liquid crystal material is affected by voltages applied across the electrodes on either side of the liquid crystal material. Typically, voltage applied to the pixel electrode effects a change in the optical properties of the liquid crystal material. This optical change causes the display of information on the liquid crystal display (LCD) screen. In conventional digital watch displays and in newer LCD display screens used in some miniature television receivers, the visual effect is typically produced by variations in reflected light. However, the utilization of transparent front and back panels and transparent electrodes also permits the visual effects to be produced by transmissive effects. These transmissive effects may be facilitated by separately powered light sources for the display, including fluorescent light type devices. LCD display screens may also be employed to produce color images throught the incorporation of color filter mosaics in registration with the pixel electrode array. Some of the structures may employ polarizing filters to either enhance or provide the desired visual effect.

Various electrical mechanisms are employed to sequentially turn on and off individual pixel elements in an LCD display. For example, metal oxide varistor devices have been employed for this purpose. However, the utilization of thin film semiconductor switch elements is most relevant herein. In particular, the switch element of the present invention comprises a thin film field effect transistor employing a layer of amorphous silicon. These devices are preferred in LCD devices because of their potentially small size, low power consumption, switching speeds, ease of fabrication, and compatibility with conventional LCD structures. However, fabrication processes for certain desired semiconductor switch element structures have been found to be incompatible with the employment of certain materials used in the transparent LCD electrodes. It is seen that while certain physical FET structures or LCD devices are desirable, it is often extremely difficult to devise processes that satisfactorily produce the desired structure. In particular, in any process of the kind contemplated herein, the number of masking steps is desired to be low since, in general, the greater the process complexity the lower is the reliability of the resulting device and the process yield.

One of the significant materials problems that can arise in the fabrication of thin film FETs for LCD screens is the problem of providing good electrical contact between source and drain line metal and the amorphous silicon layer of the FET. In general, molybdenum is a desirable metal to employ for source and drain electrode pads, but molybdenum may not exhibit good electrical contact with intrinsic amorphous silicon. A thin layer of aluminum disposed between the molybdenum and the amorphous silicon may be provided as discussed in concurrently filed application Ser. No. 761,939 filed Aug. 2, 1985, which is assigned to the same assignee. However, care must be taken to avoid etchant compatibility problems with indium tin oxide employed for the pixel electrodes. Moreover, aluminum has a tendency to diffuse into the silicon material, thus potentially degrading device performance, particularly if high process temperatures are employed in subsequent process steps.

Another significant problem encountered in LCD devices is the tendency for capacitive discharge to occur during off cycles. In this situation, the capacitor formed by the pixel electrode, the ground plane electrode and the liquid crystal material as a dielectric, tends to discharge through the FET if the FET device characteristics are inappropriate. In particular, it is desirable to limit FET current under conditions of reverse gate voltage. If the source drain current is high under these conditions capacitive leakage tends to occur and this can affect display quality. It is also desirable that the current voltage characteristics do not exhibit large hysteresis loops, since this can result in voltage uncertainty on the pixel electrode.

Further, there are a number of papers which discuss amorphous silicon FETs with N+ amorphous silicon for matrix addressed liquid crystal display applications. These papers include the following: "Proceedings of the 1982 International Display Research Conference" by A. Lakatos, pages 146-151, IEEE (1982); "Society for Information Display (SID) Digest" by Kouji Souzuki, pages 146, 147 (1983); "Applied Physics", Volume 24, page 357, by Snell et al. (1981); "Elec. Letter", Volume 18, No. 20, by Stroomer et al. (Sept. 1982); "Proceedings of the Third International Display Research Conference", Paper No. 5.3, by M. Sugata et al., SID and ITE (Oct. 1983). However, none of these papers describe use of the specific materials and process described herein.

SUMMARY OF THE INVENTION

In accordance with a preferred embodiment of the present invention, a process for the fabrication of thin film field effect transistors comprises a multi-step process employing titanium as a gate electrode material, indium tin oxide as a pixel electrode material, and N+ amorphous silicon as a means for bonding source and drain electrode pads to an amorphous silicon surface. The N+ layer employed also serves to significantly enhance FET device characteristics. In the process of the present invention, a gate metallization pattern layer is disposed on an insulating substrate. The gate layer comprises titanium. An indium tin oxide pixel electrode pattern is then disposed on the substrate followed by a layer of silicon nitride, a layer of amorphous silicon and a layer of N+ amorphous silicon. The silicon layers are patterned to form an island structure which eventually comprises the active portions of the FET. It is important to note herein that the silicon islands may be formed with only one masking step. Source and drain metallization is then applied over the substrate and this layer is patterned to provide source and drain contacts in electrical connection with the N+ silicon and at the same time, the patterning of the source and drain electrodes results in the formation of source (data) and drain lines. Either the source or drain lines are connected so as to be in electrical contact with the individual pixel electrodes, the other of these two FET electrodes being connected to the data lines. The gate electrodes are connected to the gate drive lines.

Accordingly, it is an object of the present invention to provide a process for the fabrication of thin film field effect transistors which exhibit the electrical characteristics of low back current and small hysteresis.

It is a further object of the present invention to provide a process for thin film field effect transistor fabrication in conjunction with the fabrication of liquid crystal display devices.

It is yet another object of the present invention to provide an active matrix LCD display exhibiting improved source drain metallization contact to underlying amorphous silicon material.

It is a still further object of the present invention to provide materials and processes exhibiting chemical compatibility, particularly with respect to the use of molybdenum for source and drain metallization.

Lastly, but not limited hereto, it is an object of the present invention to provide a process for the fabrication of thin film field effect transistors and associated LCD display devices exhibiting increased manufacturing yield and more reliable components and displays.

DESCRIPTION OF THE DRAWINGS

The subject matter which is regarded as the invention is particularly pointed out and distinctly claimed in the concluding portion of the specification. The invention itself, however, both as to organization and method of practice, together with further objects and advantages thereof, may best be understood by reference to the following description taken in connection with the accompanying drawings in which:

FIGS. 4E'-4F' are cross-sectional side elevation views illustrating sequential steps in the fabrication of an FET structure in accordance with an alternate embodiment of the present invention.

DETAILED DESCRIPTION OF THE INVENTION

Figure 1:
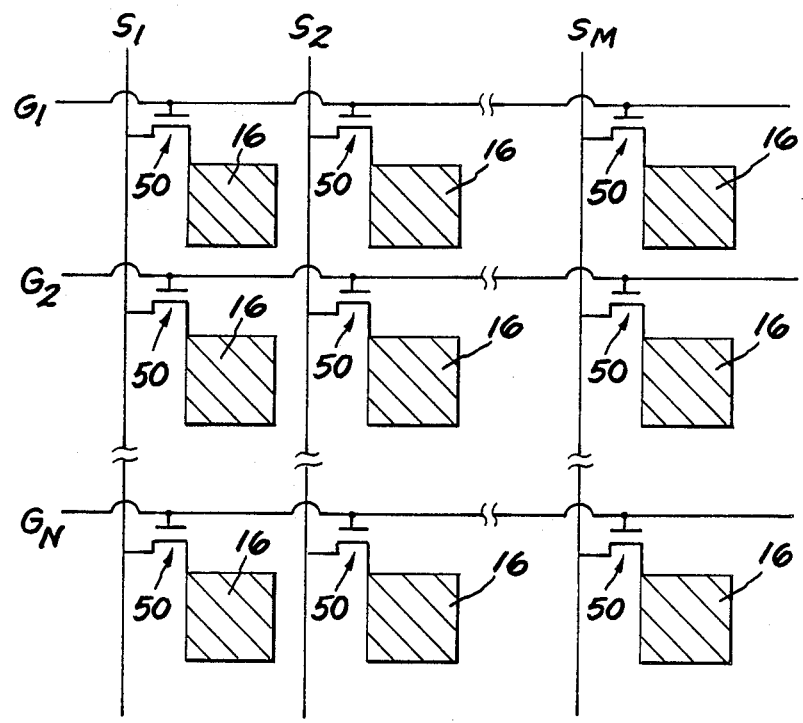
FIG. 1 is a schematic electrical circuit diagram illustrating the context in which the thin film FETs of the present invention are employed.

FIG. 1 illustrates, in schematic diagram form, a matrix addressed liquid crystal display circuit. In particular there is shown an N by M array of pixel electrodes 16 together with associated FET switching elements 50. The gate electrodes of the switching elements in row i are connected to gate drive line $G_i$. Likewise, the source electrode in each column j is connected to data or source line $S_j$. In the figure shown, j ranges from 1 to M and i ranges from 1 to N. It should be realized, however, that many FET structures are symmetric with respect to source and drain properties and that in many situations the source and drain connections can be reversed. However, FIG. 1 particularly shows each pixel electrode 16 being connected to the drain of its associated switching FET. In operation, the pixel element in the $i^{th}$ row and $j^{th}$ column is switched on by simultaneously applying appropriate signals to gate line $G_i$ and data line $S_j$. This applies a voltage to pixel electrodes 16 which acts to alter the optical properties of liquid crystal materials disposed between pixel electrode 16 and the ground plane or counter electrode (not visible in FIG. 1, see reference numeral 76 in FIG. 2). Pixel electrodes 16 comprise a transparent conductive material such as indium tin oxide.

Figure 2:
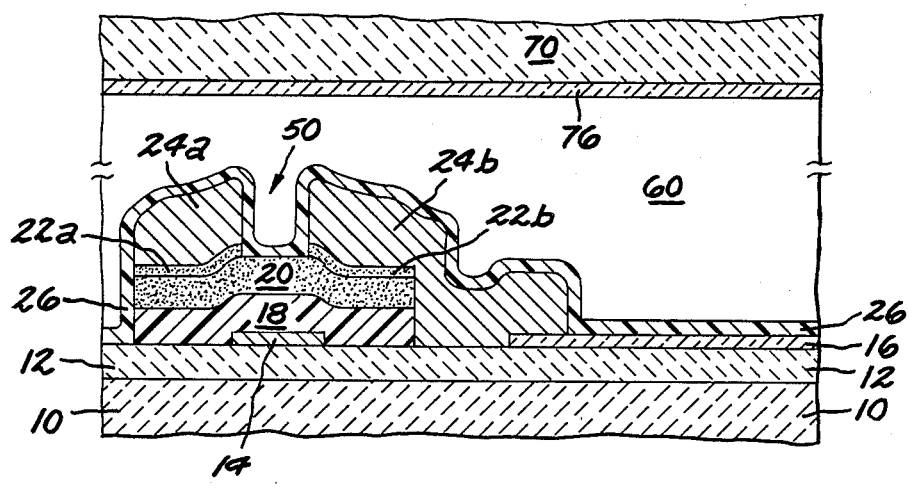
FIG. 2 is a cross sectional side elevation view of a portion of an LCD pixel cell including the FET structure of present invention.

FIG. 2 illustrates a portion of a liquid crystal display device in accordance with the present invention. More particularly, FIG. 2 illustrates both the upper and lower panel for an LCD display. Also illustrated is the physical relationship between the FET structure and a pixel electrode. In FIG. 2 there is shown upper LCD panel 70 which typically comprises a material such as glass. Also disposed on the lower surface of panel 70 is a thin coating of a material such as indium tin oxide 76 which acts as a transparent counter electrode or ground plane electrode. Electrical potential differences appearing between ground plane electrode 76 and pixel electrode 16 produce optical variations in liquid crystal material 60 disposed between these electrodes. It is the optical effects produced by this potential difference which cause information to be displayed on the LCD device. FET 50 and pixel electrode 16 are disposed on an insulative coating 12 on lower LCD display panel 10. Coating 12 typically comprises a material such as silicon dioxide. Panel 10 typically comprises a material such as glass. In general, panel 70, panel electrode 76, pixel electrode 16, coating 12 and panel 10 may all comprise transparent material. This is particularly useful in LCD displays in which back lighting is employed to form the desired image. However, it is only necessary for either upper panel 70 or lower substrate 10, together with its associated electrode coating, to be transparent.

As indicated above, pixel electrodes 16 are disposed on one of the LCD display panels. It is also necessary to connect each pixel electrode 16 with its associated semiconductor switching element. In the present application, semiconductor switching element 50 comprises an amorphous-silicon-based field effect transistor which includes gate electrode 14 preferably comprising titanium. Over gate electrode 14, there is disposed an insulating layer 18, typically comprising a material such as silicon nitride. Over insulating layer 18, there is disposed an active layer of amorphous silicon 20. In general, it is desirable to dispose source and drain electrodes in direct contact with active silicon material. However, desirable materials such as molybdenum employed in the source and drain metallization layer may not form good electrical contact with intrinsic amorphous silicon. Accordingly, it is therefore desirable to employ a layer of $N^+$ amorphous silicon as an intermediate layer to facilitate and enhance the electrical connection to the amorphous silicon. In the present invention, this involves the fabrication of $N^+$ amorphous silicon layers 22a and 22b for electrodes 24a and 24b, respectively. At the same time, drain electrode 24b and source electrode 24a are fabricated and disposed so as to provide electrical contact to pixel electrode 16, as shown. Finally, a layer of passivation material 26, such as silicon nitride is disposed over the lower LCD display substrate.

It should also be noted from FIG. 2 that gate electrode 14, together with the associated gate drive lines are in contact with layer 12 as is indium tin oxide layer 16. If these layers are to be deposited at approximately the same step in the fabrication process, the materials chosen for these layers must exhibit some degree of compatibility. This is particularly true with respect to etchants employed in patterning these layers. Accordingly, the structure and process of the present invention employs titanium as a gate electrode material and indium tin oxide as a transparent pixel electrode material. Note, however, that these compatibility problems do not apply to the ground plane electrode disposed on upper substrate 70.

Figure 3A:
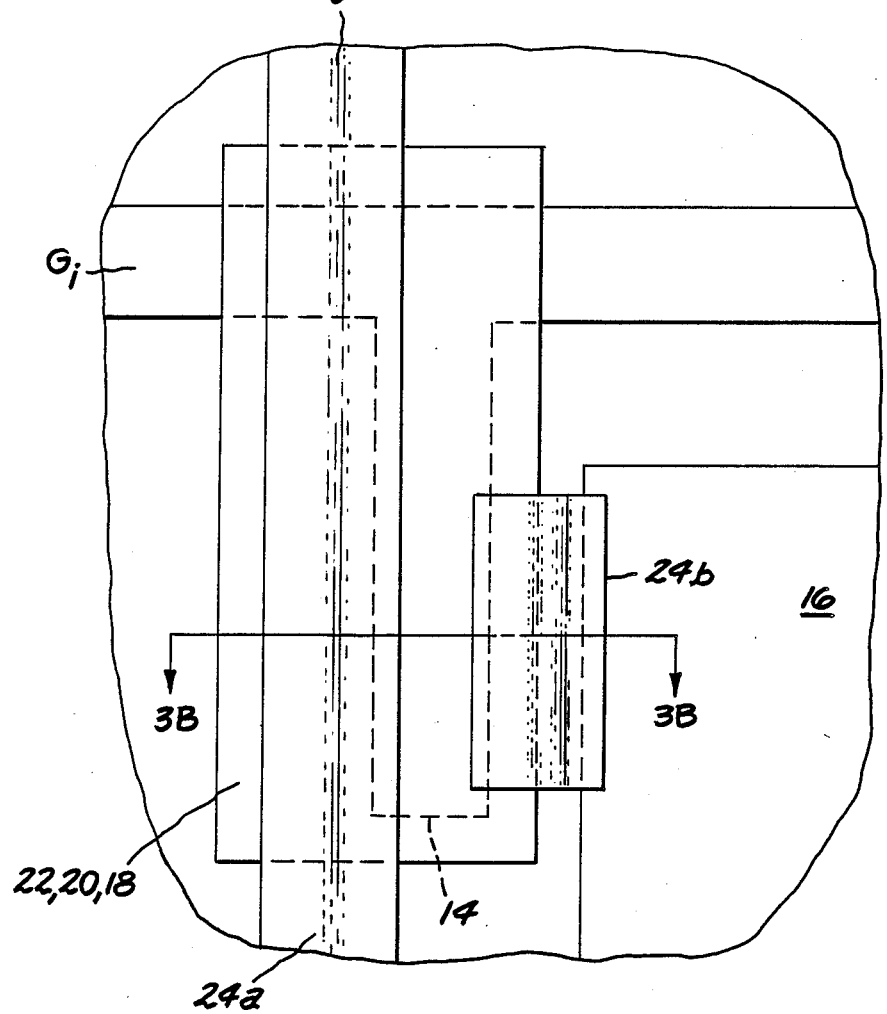
FIG. 3A is a plan view of an FET and a portion of a pixel electrode, in accordance with the present invention.

FIG. 3A is a plan view detailing the physical structure of a switching element 50 and its associated pixel electrode 16 in the vicinity of the intersection of gate drive line $G_i$ and data drive line $S_j$. For completeness, corresponding structures are illustrated in cross-section in FIG. 3B. In particular, FIG. 3A illustrates the presence of an insulative island principally comprising insulative layer 18, intrinsic amorphous silicon layer 20 and $N^+$ amorphous silicon layer 22. This island provides insulation between data line $S_j$ and gate line $G_i$. It is also seen that data line $S_j$ may also serve directly as the source electrode (or the drain electrode in a reverse situation) for a thin film FET. It is also seen that gate electrode 14 is preferably provided as an extension of gate drive line $G_i$. The gate drive lines and the gate electrodes are most preferably fabricated in the same process step and comprise the same material and in this particular invention, titanium is employed to ensure compatibility with indium tin oxide pixel electrode 16.

Figure 3B:
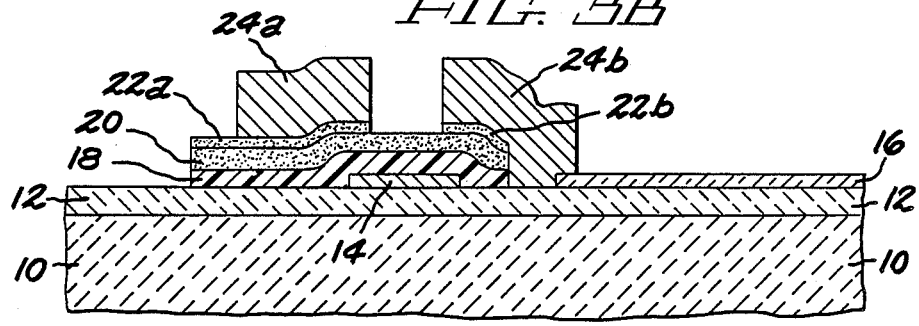
FIG. 3B is a cross sectional side elevation view which more particularly illustrates alignment of the FET structure with portions shown in the plan view of FIG. 3A.

Since the gate electrode is fabricated in an early process step and is disposed on the underlying insulative substrate and since the gate insulation layer also insulates the gate and source electrodes, the FET structures shown in FIGS. 2 and 3B are described as being inverted FETs. This term, however, applies only to their physical rather than to their electrical properties.

Although it may appear that the structure shown in FIGS. 1, 2 and 3 is readily constructable, it must also be appreciated that there are significant material and material etchant compatibility problems involved in fabricating the structure shown. The process of the present invention employs materials and steps which overcome these compatibility problems and at the same time results in a fabrication process employing a minimal number of masking operations. The use of a large number of masking operations is, in general, to be avoided because of the problems of device reliability and yield. Accordingly, FIGS. 4A through 4J illustrate various steps in the fabrication of devices like the ones shown in FIGS. 1 through 3. In particular, the fabrication process illustrated in these figures is directed to the production of thin film amorphous silicon based FET switching elements which are compatible with the utilization of molybdenum as a source-drain metal.

In the process in accordance with the present invention, an insulative substrate such as glass is cleaned in order to bring the surface up to processing quality. Insulative coating 12 such as a layer of silicon oxide is then provided on one side of substrate 10 to provide a stable surface for further processing. However, recent studies show this layer is optional. Insulative coating 12 typically comprises a layer of silicon oxide sputter deposited to a thickness of approximately 1,200 Angstroms.

Titanium is then deposited, patterned and plasma etched to form the gates of the FETs and the gate drive lines. The deposition of the gate drive lines on insulative coating 12 is generally performed in accordance with conventional masking and patterning techniques. For example, a layer of titanium may be deposited by electron beam evaporation to a thickness of approximately 800 Angstroms. This layer is coated with a resist and exposed to the desired masking pattern. The substrate is then plasma etched and followed by wet etching to form the gate patterns. In a preferred embodiment of the present invention, oxygen ashing of the resist is carried out at this step and performs a dual function, namely, cleaning off the resist as well as exposing the gate metal to an oxygen environment which toughens it prior to plasma etching during island definition.

Figure 4E:
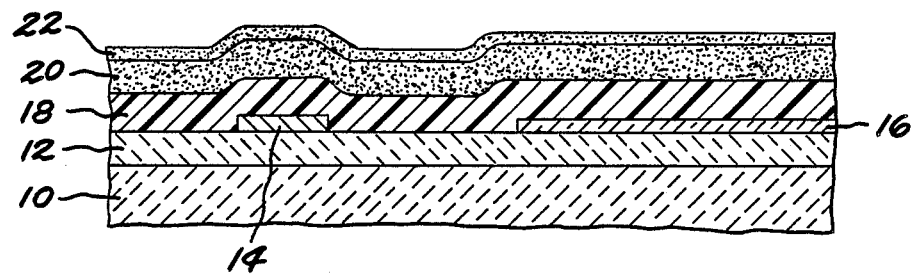
FIGS. 4A-4I are cross sectional side elevation views illustrating sequential steps in the fabrication of the FET structure and LCD structure of the present invention.
Figure 4F:
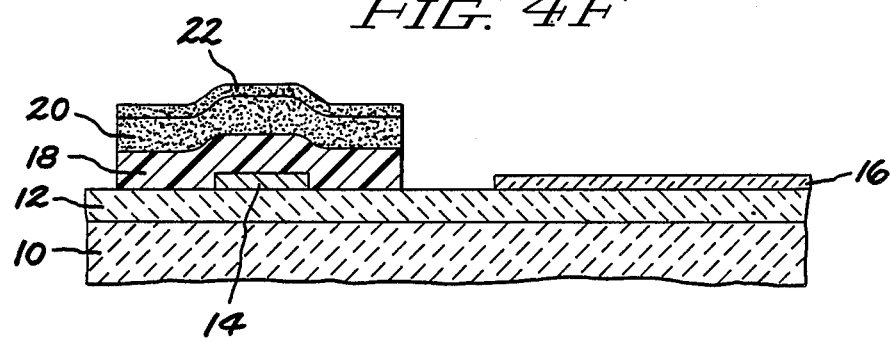
Figure 4E:
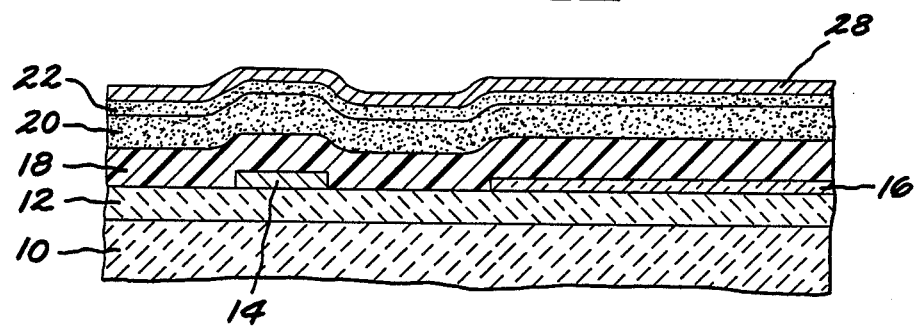
Figure 4F:
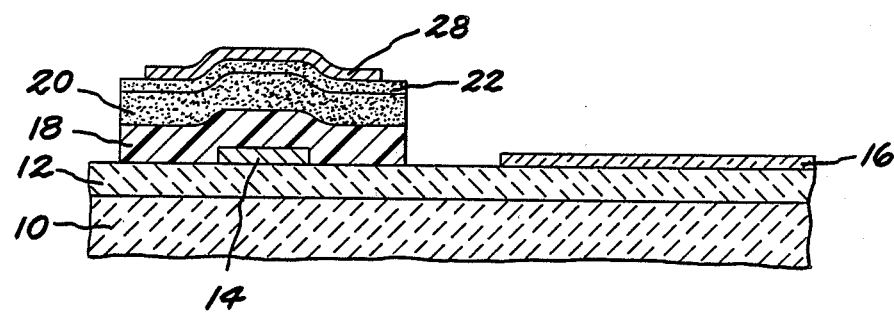
Figure 4G:
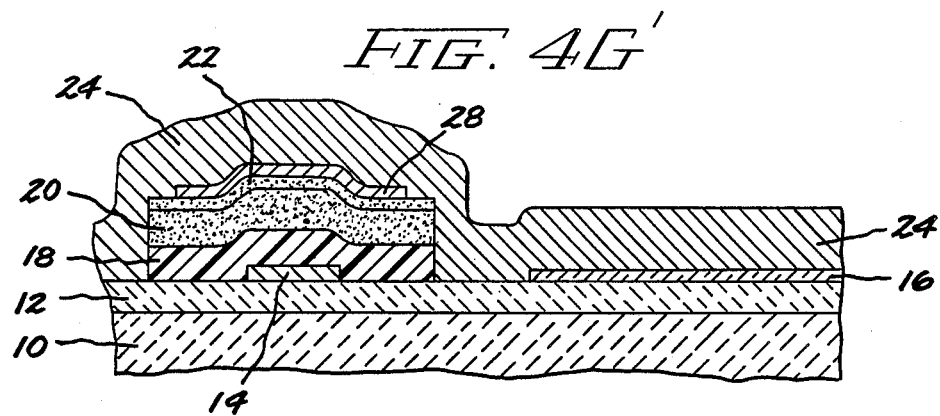
Figure 4H:
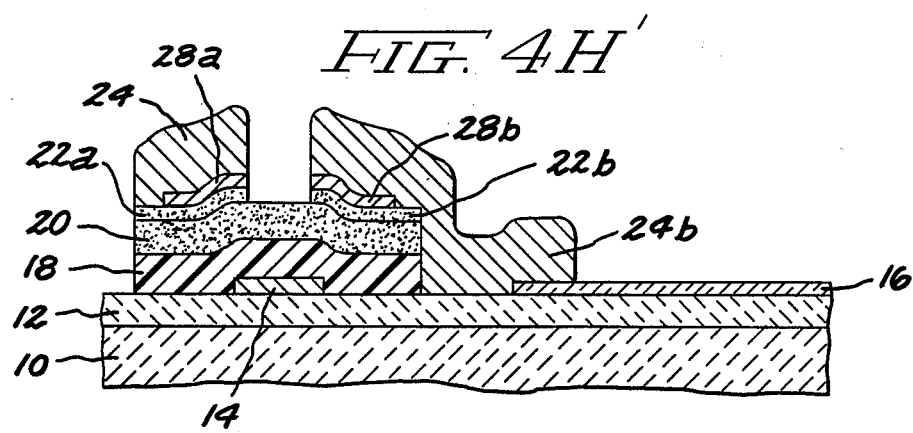
Figure 4I:
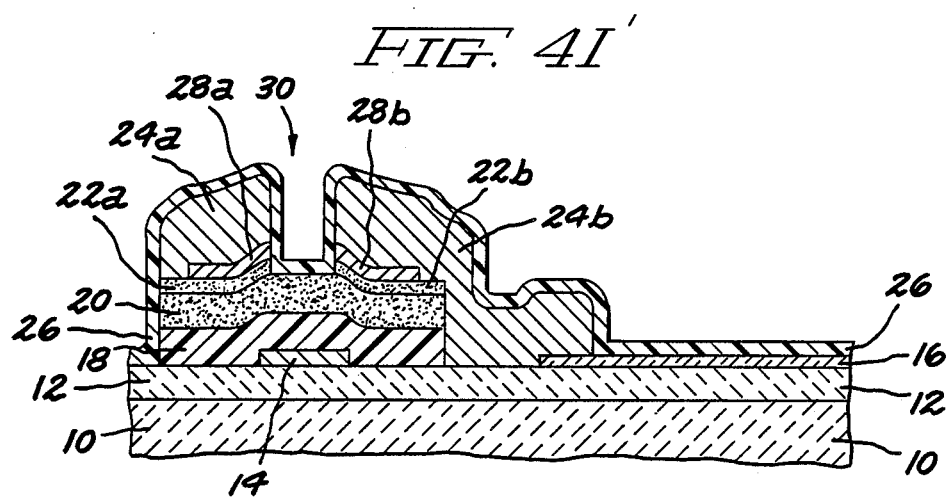
Figure 4A:
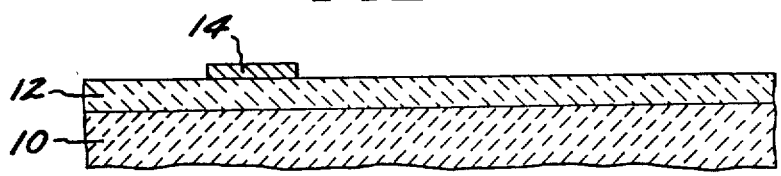
Figure 4B:
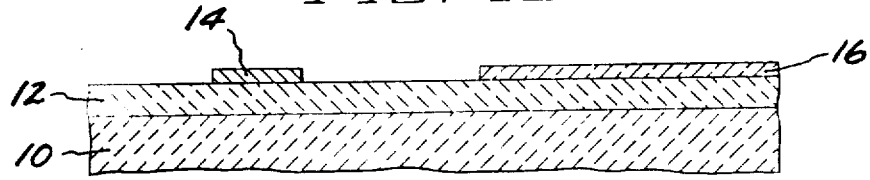

FIG. 4B illustrates the next step in the process of the present invention. In this step, indium tin oxide pixel electrode material 16 is sputter deposited and wet etched. The process step illustrated in FIG. 4B, therefore, represents the second masking step employed in the present invention. The formation of the pixel electrodes is performed after the formation of the gate metallization pattern to avoid exposure to the etchants used to pattern the gate material. The material of pixel electrode 16 is preferably deposited by sputter deposition of indium tin oxide to a thickness of approximately 900 Angstroms.

Figure 4C:
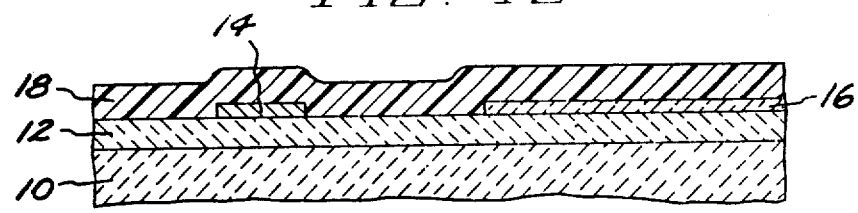
Figure 4D:
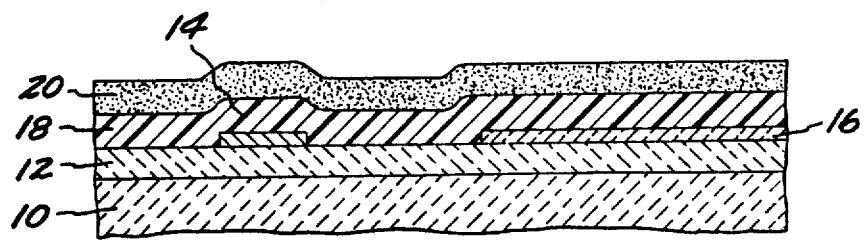

FIG. 4C illustrates the next step in the process of the present invention which is deposition of insulating layer 18. This layer preferably comprises silicon nitride which is preferably formed by plasma enhanced chemical vapor deposition (PECVD) to a thickness of approximately 1,500 Angstroms. Next, amorphous silicon layer 20 is likewise deposited to a thickness of approximately 2,000 Angstroms. It should be noted the formation of the silicon nitride, amorphous silicon and $N^+$ silicon layers is preferably performed in a single operation, that is, they are deposited sequentially merely by changing the gases employed in the vacuum vessel without breaking its seal. For a general description of the PECVD process see "Plasma-promoted Deposition of Thin Inorganic Films" by M. Rand in J. Vac. Sci. Tech., Vol. 16, page 420 (1979). Although it is significantly less desirable, it is also possible to form the amorphous silicon layer by sputtering and subsequent hydrogenation. The resulting structure is shown in FIG. 4D. Next, a layer of N+ amorphous silicon is deposited on the substrate. The resultant structure is shown in FIG. 4E. The N+ silicon layer is designated by reference numeral 22. The silicon nitride, amorphous silicon and N+ silicon layers are deposited by plasma enhanced chemical vapor deposition. For the amorphous silicon layer the deposition is carried out in an atmosphere of argon with 10% silane, $SiH_4$. For the silicon nitride deposition an atmosphere of argon, ammonia and silane is employed. For the N+ amorphous silicon an atmosphere of argon, silane and 0.1% phosphine (by volume), $PH_3$ is employed. The N+ silicon layer is deposited to a thickness of approximately 500 Angstroms.

FIG. 4F illustrates the next step in the process in which the amorphous intrinsic silicon, N+ silicon and nitride layers are patterned to form islands. This operation represents the third masking step. The etchant employed to remove the silicon nitride and amorphous silicon layers does not attack the indium tin oxide layer.

FIG. 4G illustrates the next step in the process of the present invention in which a layer of molybdenum is deposited on the substrate. For example, a 3,000 Angstrom thick layer 24 of molybdenum may be so deposited. As shown in FIG. 4H, this layer is then patterned using a wet etch with a mixture of phosphoric acetic and nitric acids (PAWN) with no attack of the indium tin oxide material. This is the fourth and last masking operation. The N+ material in the channel is removed by plasma etching using the molybdenum as a mask. This step, which requires no additional mask, is called back channel etching. Some of layer 20 is also removed in this process step. The molybdenum source-drain deposition forms a silicide around the edge of the island which results in gate and source drain leakage. However, this is eliminated by plasma etching of the exposed silicon surface (back channel etching) and the device is then deposited with a low temperature nitride for protection and passivation of the exposed silicon surface. See FIG. 4I.

In an alternate embodiment of the present invention, a 500 Angstrom thick layer of molybdenum 28 is deposited over the layer of N+ silicon as shown in FIG. 4E'. This layer is then mesa island etched. The use of this layer serves to achieve reliable electrical contact between the N+ silicon layer and subsequent source and drain metallization connections. This alternate embodiment also has the advantage that the time interval between the deposition of the N+ silicon layer and the thin molybdenum layer is not important as long as additional processing steps are not carried out in the interim. The silicon island is then patterned and the total silicon and silicon nitride "sandwich" is plasma etched. Following this, the wafer is provided with molybdenum source and drain metallization, which is patterned and etched. The thin molybdenum pattern layer is preferably slightly smaller than the silicon and silicon nitride island. The above mentioned process steps are illustrated in FIGS. 4E'-4I'.

Figure 5:
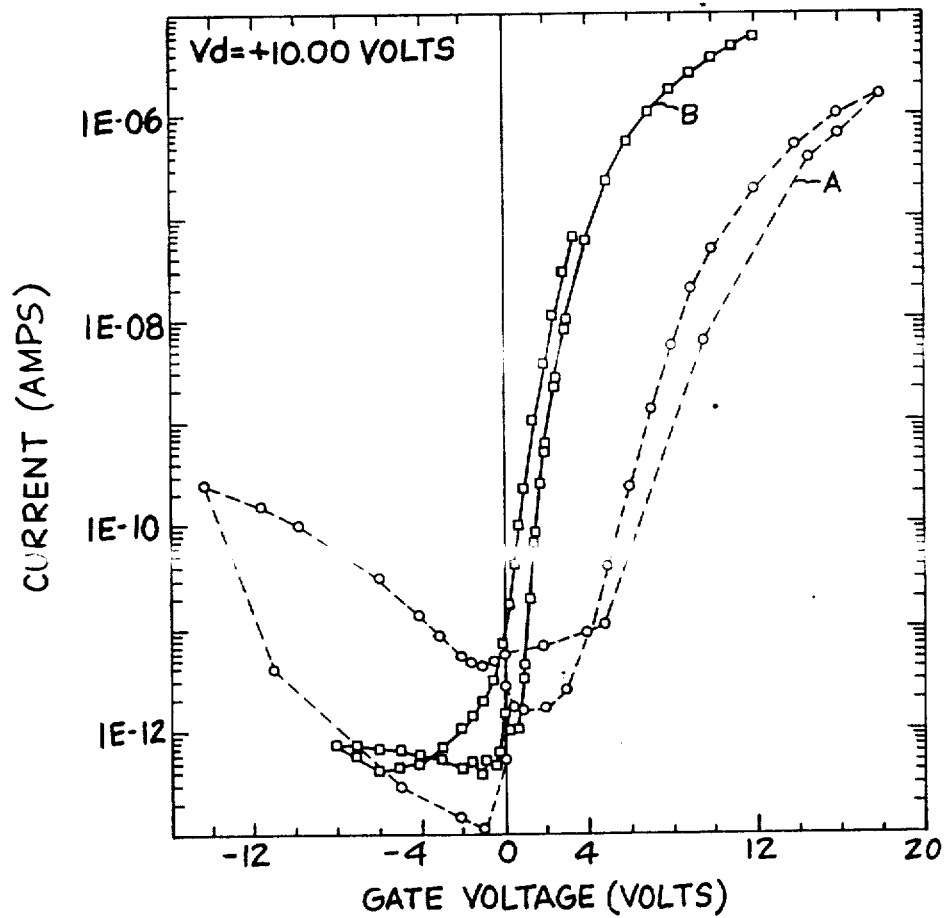
FIG. 5 is a plot of source-drain current as a function of gate voltage for conventional thin film FETs (curve A) and for thin film FETs employing N+ amorphous silicon in accordance with the present invention (curve B).

The inclusion of the N+ amorphous silicon layer in the present invention provides significant performance advantages for the FET, particularly in comparison with FETs employing an aluminum layer over intrinsic amorphous silicon. The electrical characteristics of the latter type of FET device are shown as curve A in FIG. 5 which is a plot of source-drain current in amperes as a function of gate voltage (forward and reverse). Curve B is a similar plot for an FET employing a layer of N+ amorphous silicon in accordance with the present invention. Several features of these curves are particularly noteworthy. In particular, it is seen that the current in the reverse direction is approximately two orders of magnitude lower for the devices produced in accordance with the present invention. This means that the tendency for capacitive leakage to occur is much less prevalent in devices and displays fabricated in accordance with the present invention. It is also noted that there is a much larger hysteresis effect for aluminum/intrinsic amorphous silicon FETs as compared with FETs of the present invention. Additional data collected but not shown in FIG. 5 indicated that low current conditions for reverse gate bias also extends beyond the $-8$ volt range all the way to the $-12$ volt range for curve B. Lastly, it is also noted that the forward current is much more responsive to gate voltage levels in curve B, as compared with curve A.

From the above, it should be appreciated that the thin film FET and liquid crystal display device and process of the present invention solves the problem of electrode contact to amorphous silicon while at the same time maintaining material composition compatibility for simplified LCD device fabrication. In particular, it is seen that the essential parts of LCD device may be fabricated in a process employing only four masking steps. It is also seen that the process steps are carried out in a particular order with specified materials to ensure that chemical process compatibility. It is also seen that the process of the present invention are such as to be compatible with a large variety of liquid crystal display systems and with a large variety of liquid crystal materials. It should also be appreciated that the present invention is one which is readily fabricatable using relatively conventional VLSI processing methods so as to enable the reliable and high yield fabrication of responsive high resolution liquid crystal display devices.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A process for the fabrication of thin film field effect transistors in active matrix liquid crystal display devices, said process comprising the sequential steps of:
    disposing a gate metallization layer pattern on a portion of a first major surface of an insulative substrate, said gate metal comprising titanium, said pattern including gate electrodes and;
    disposing a pixel electrode pattern on a portion of the first major surface of said substrate, said pixel electrode material comprising indium tin oxide;
    disposing a layer of protective insulative material over said first major substrate surface including said gate metal pattern and said pixel electrode pattern;
    disposing a layer of intrinsic amorphous silicon over said protective insulative material;

disposing a layer of N+ amorphous silicon over said intrinsic amorphous silicon;

patterning said protective insulative material, said intrinsic amorphous silicon and said N+ amorphous silicon layers so as to form islands over said gate metal, whereby each island formed includes protective insulative material, intrinsic amorphous silicon and N+ amorphous silicon layers;

disposing a source and drain metallization layer over the first major surface of said substrate; and patterning said source and drain metallization layer and said N+ silicon layer so as to form field effect transistor devices.

2. The fabrication process of claim 1 in which said gate metallization layer pattern is disposed by vapor deposition and plasma etching.

3. The fabrication process of claim 1 in which said pixel electrode pattern is disposed by sputter deposition and wet etching.

4. The fabrication process of claim 1 in which said protective insulating material comprises silicon nitride which is disposed by plasma enhanced chemical vapor deposition.

5. The fabrication process of claim 1 in which said amorphous silicon is disposed by plasma enhanced chemical vapor deposition.

6. The fabrication process of claim 1 in which said N+ amorphous silicon layer is disposed by plasma enhanced chemical vapor deposition.

7. The fabrication process of claim 1 in which said source and drain metallization layer is disposed by sputtering.

8. The fabrication process of claim 1 in which said source and drain metallization layer patterning comprises etching in a solution of phosphoric acid, acetic acid and weak nitric acid.

9. The fabrication process of claim 1 further comprising disposing a passivation layer over said substrate.

10. The fabrication process of claim 9 in which said passivation layer comprises silicon nitride which is formed by plasma deposition.

11. The process of claim 1 in which said protective insulative material comprises silicon nitride.

12. The fabrication process of claim 1 in which said source and drain metallization comprises molybdenum.

13. A process for the fabrication of thin film field effect transistors in active matrix liquid crystal display devices, said process comprising the sequential steps of:

disposing a gate metallization pattern on a portion of a first major surface of an insulative substrate, said gate metal comprising titanium, said pattern including gate electrodes and disposing a pixel electrode pattern on a portion of the first major surface of said substrate, said pixel electrode material comprising indium tin oxide;

disposing a layer of protective insulative material over said first major substrate surface including said gate metal pattern and said pixel electrode pattern;

disposing a layer of intrinsic amorphous silicon over said protective insulative material;

disposing a layer of N+ amorphous silicon over said intrinsic amorphous silicon;

disposing a layer of molybdenum over said N+ silicon layer;

patterning said molybdenum layer so as to form islands over said gate metal;

patterning said protective insulative material, said intrinsic amorphous silicon and said N+ amorphous silicon layers so as to form islands said gate metal, the islands being substantially the same size or slightly larger than said molybdenum island on insulative material layer, the intrinsic amorphous silicon layer, the N+ amorphous silicon layer and the molybdenum layer disposing a source and drain metallization layer over the first major surface of said substrate; and patterning said source and drain metallization layer and said N+ silicon layer so as to form field effect transistor devices.

14. The process of claim 13 in which said protective insulative material comprises silicon nitride.

15. The process of claim 13 in which said source and drain metallization also comprises molybdenum.

* * * * *

UNITED STATES PATENT AND TRADEMARK OFFICE
CERTIFICATE OF CORRECTION

Page 1 of 3

PATENT NO. : 4,933,296
DATED : June 12, 1990
INVENTOR(S) : H.G. Parks et al.

It is certified that error appears in the above-identified patent and that said Letters Patent is hereby corrected as shown below:

The Sheets of drawings, consisting of Figs 4A, 4B, 4C, 4D and 5 should be added as per attached sheets.

Title page, "6 Drawing Sheets" should read --8 Drawing Sheets--

Signed and Sealed this

Thirty-first Day of March, 1992

Attest:

HARRY F. MANBECK, JR.

*Attesting Officer*   *Commissioner of Patents and Trademarks*